(12) United States Patent
Iguchi et al.

(10) Patent No.: US 10,868,124 B2
(45) Date of Patent: Dec. 15, 2020

(54) GROUP III NITRIDE SEMICONDUCTOR SUBSTRATE

(71) Applicant: KABUSHIKI KAISHA TOYOTA CHUO KENKYUSHO, Nagakute (JP)

(72) Inventors: Hiroko Iguchi, Nagakute (JP); Tetsuo Narita, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 16/207,788

(22) Filed: Dec. 3, 2018

(65) Prior Publication Data
US 2019/0181230 A1 Jun. 13, 2019

(30) Foreign Application Priority Data
Dec. 12, 2017 (JP) .................. 2017-237911

(51) Int. Cl.
*H01L 29/20* (2006.01)
*H01L 31/0304* (2006.01)
(Continued)

(52) U.S. Cl.
CPC ...... *H01L 29/2003* (2013.01); *H01L 21/0254* (2013.01); *H01L 21/2656* (2013.01);
(Continued)

(58) Field of Classification Search
CPC ......... H01L 29/06; H01L 29/20; H01L 31/20; H01L 31/0296; H01L 31/02966; H01L 31/1828; H01L 31/1836; H01L 31/0304; H01L 31/03048; H01L 31/184; H01L 31/1856; H01L 31/028; H01L 31/0256; H01L 31/03365; H01L 31/1804; H01L 31/0288; H01L 31/0312; H01L 31/03125; H01L 31/1824; H01L 31/032;
(Continued)

(56) References Cited

U.S. PATENT DOCUMENTS

2003/0080384 A1* 5/2003 Takahashi ......... H01L 29/66068
257/347
2007/0187693 A1 8/2007 Kobayakawa et al.
(Continued)

FOREIGN PATENT DOCUMENTS

JP 2004-356257 A 12/2004
JP 2005-286318 A 10/2005
(Continued)

OTHER PUBLICATIONS

Jan. 21, 2020 Office Action issued in Japanese Patent Application No. 2017-237911.

*Primary Examiner* — Chuong A Luu
(74) *Attorney, Agent, or Firm* — Oliff PLC

(57) ABSTRACT

A group III nitride semiconductor substrate may include: a p-type conduction region into which a group II element has been implanted in a depth direction of the group III nitride semiconductor substrate from a surface of the group III nitride semiconductor substrate, the p-type conduction region having p-type conductivity, wherein hydrogen has been implanted from the p-type conduction region across an n-type conduction region adjacent to the p-type conduction region in the depth direction of the group III nitride semiconductor substrate.

6 Claims, 5 Drawing Sheets

(51) Int. Cl.
*H01L 29/06* (2006.01)
*H01L 21/02* (2006.01)
*H01L 21/265* (2006.01)
*H01L 29/861* (2006.01)
*H01L 29/04* (2006.01)

(52) U.S. Cl.
CPC .... *H01L 21/26553* (2013.01); *H01L 29/0619* (2013.01); *H01L 29/861* (2013.01); *H01L 31/03044* (2013.01); *H01L 29/045* (2013.01)

(58) Field of Classification Search
CPC ............. H01L 31/0327; H01L 31/0328; H01L 31/208; H01L 31/022408; H01L 31/022416
USPC .......................................................... 257/201
See application file for complete search history.

(56) References Cited

U.S. PATENT DOCUMENTS

| | | | |
|---|---|---|---|
| 2017/0077830 A1 | 3/2017 | Fujii et al. | |
| 2017/0133552 A1* | 5/2017 | Lai ....................... | H01L 33/025 |
| 2017/0140934 A1* | 5/2017 | Hamada ............. | H01L 29/1608 |
| 2017/0141270 A1 | 5/2017 | Kaneda et al. | |

FOREIGN PATENT DOCUMENTS

| | | |
|---|---|---|
| JP | 2015-233097 A | 12/2015 |
| JP | 2017-054944 A | 3/2017 |
| JP | 2017-212407 A | 11/2017 |

\* cited by examiner

GROUP III NITRIDE SEMICONDUCTOR SUBSTRATE

CROSS-REFERENCE

This application claims priority to Japanese Patent Application No. 2017-237911 filed on Dec. 12, 2017, the contents of which are hereby incorporated by reference into the present application.

TECHNICAL FIELD

The disclosure herein relates to a group III nitride semiconductor substrate.

DESCRIPTION OF RELATED ART

Japanese Patent Application Publication No. 2005-286318 describes a group III nitride semiconductor substrate (a GaN substrate). The group III nitride semiconductor substrate of Japanese Patent Application Publication No. 2005-286318 is provided with a magnesium implanted region into which magnesium has been implanted in a depth direction from a front surface of the group III nitride semiconductor substrate. A concentration of magnesium in the magnesium implanted region is higher than a concentration of magnesium in a region adjacent to the magnesium implanted region. The group III nitride semiconductor substrate of Japanese Patent Application Publication No. 2005-286318 is further provided with a hydrogen doped region into which hydrogen has been doped up to a lower end of the magnesium implanted region in the depth direction of the group III nitride semiconductor substrate. A concentration of hydrogen in the hydrogen doped region is higher than a concentration of hydrogen in a region adjacent to the hydrogen doped region.

SUMMARY

In the group III nitride semiconductor substrate of Japanese Patent Application Publication No. 2005-286318, the hydrogen doped region exists only up to the lower end of the magnesium implanted region. Due to this, there had been a limitation in reducing a leakage current when a reverse voltage is applied on the group III nitride semiconductor substrate. In view of this, the disclosure herein provides a technique for further reducing a leakage current when a reverse voltage is applied.

A group III nitride semiconductor substrate disclosed herein may comprise a p-type conduction region into which a group II element has been implanted in a depth direction of the group III nitride semiconductor substrate from a surface of the group III nitride semiconductor substrate, and the p-type conduction region has p-type conductivity. Further, hydrogen may be implanted from the p-type conduction region across an n-type conduction region adjacent to the p-type conduction region in the depth direction of the group III nitride semiconductor substrate.

Point defects formed by implantation of the group II element into the aforementioned group III nitride semiconductor substrate include group III element vacancies and nitrogen vacancies. The nitrogen vacancies are likely to be formed in the p-type conduction region, and compensate acceptors. In the group III nitride semiconductor substrate, hole mobility is lower than electron mobility approximately by double digits, and acceptor activity rate is also low. Due to this, in the p-type conduction region, carrier conduction (hole conduction) is greatly affected by compensation effect. Further, complex defects of the group III element vacancy, the nitrogen vacancy and hydrogen have lower formation energy than complex defects of the group III element vacancy and the nitrogen vacancy. Due to this, by implanting hydrogen into the n-type conduction region and performing active annealing, the complex defects of the group III element vacancy, the nitrogen vacancy and hydrogen can be aggregated, in the n-type conduction region. By providing a peak of hydrogen concentration in a portion of the n-type conduction region that is apart from an interface, at which electric field concentrates, between the p-type conduction region and the n-type conduction region, a leakage current when a reverse voltage is applied can be further reduced.

The group III nitride semiconductor substrate disclosed herein may further comprise a group II element implanted region into which a group II element has been implanted in the depth direction of the group III nitride semiconductor substrate from the surface of the group III nitride semiconductor substrate; and a hydrogen implanted region into which hydrogen has been implanted from the group II element implanted region across a region adjacent to the group II element implanted region in the depth direction of the group III nitride semiconductor substrate. A concentration of the group II element in the group II element implanted region may be higher than a concentration of the group II element in the region adjacent to the group II element implanted region. A concentration of hydrogen in the hydrogen implanted region may be higher than a concentration of hydrogen in a region adjacent to the hydrogen implanted region.

As a result of study related to group III nitride semiconductor substrates, it has been revealed that a leakage current when a reverse voltage is applied on a group III nitride semiconductor substrate is reduced by implanting not only a group II element but also hydrogen into the group III nitride semiconductor substrate, as compared to a case where only a group II element is implanted and hydrogen is not implanted. According to the aforementioned configuration, the hydrogen implanted region into which hydrogen has been implanted exists not only in the group III element implanted region but also exists from the group II element implanted region across the region adjacent to the group element implanted region. Due to this, when a reverse voltage is applied, not only a leakage current in the group II element implanted region but also a leakage current in a boundary portion between the group II element implanted region and the region adjacent thereto can be reduced.

In the aforementioned group III nitride semiconductor substrate, the concentration of hydrogen in the hydrogen implanted region may be higher than the concentration of the group II element in the group II element implanted region.

Further, the surface of the group III nitride semiconductor substrate may be a nitrogen polar surface.

Further, in a view of the surface of the group III nitride semiconductor substrate in a direction orthogonal to the surface, the group II element implanted region may exist in a part of the surface, and in a direction along the surface, the hydrogen implanted region may exist from the group II element implanted region across a region adjacent to the group II element implanted region.

Further, a distance from a periphery of the group II element implanted region to a periphery of the hydrogen implanted region in the view of the surface of the group III nitride semiconductor substrate in the direction orthogonal to the surface may be longer than a distance from the surface of the group III nitride semiconductor substrate to a lower end of the group II element implanted region in the depth direction of the group III nitride semiconductor substrate.

Further, the group II element implanted into the group II element implanted region may be magnesium.

DETAILED DESCRIPTION

A group III nitride semiconductor substrate 1 of an embodiment will be described with reference to drawings. The group III nitride semiconductor substrate 1 is a nitride semiconductor substrate including a group III element. The group III element includes, for example, gallium (Ga), aluminum (Al), indium (In), and the like.

Figure 1:
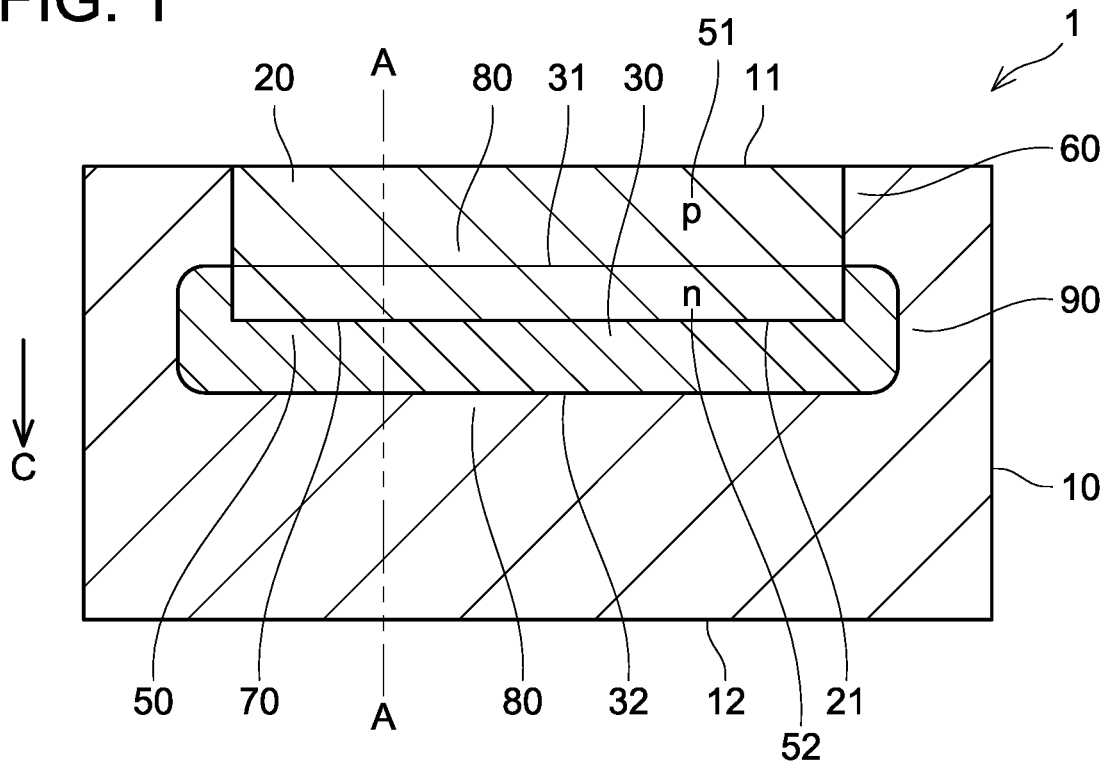
FIG. 1 is a cross-sectional view of a group III nitride semiconductor substrate of a first embodiment.

As shown in FIG. 1, the group III nitride semiconductor substrate 1 of a first embodiment comprises a body 10 constituted of single-crystal GaN (gallium nitride) of n-type. A group III nitride semiconductor constituting the body 10 is not limited to GaN, and may be, for example, AlN (aluminum nitride), InN (indium nitride), mixed crystal thereof, or the like.

A front surface of the body 10 of the group III nitride semiconductor substrate 1 is a −C plane (minus C plane). A rear surface of the body 10 is a +C plane (plus C plane). The −C plane and the +C plane are planes orthogonally intersecting a C axis of hexagonal crystal, and they are oriented to face opposite to each other. The −C plane is a [000-1] plane of the hexagonal crystal and is a nitrogen (N) polar face. Thus, the front surface 11 of the body 10 is a nitrogen polar face. The +C plane is a plane of the hexagonal crystal and is a gallium (Ga) polar face.

The group III nitride semiconductor substrate 1 comprises a magnesium implanted region 20 (an example of a group II element implanted region). The magnesium implanted region 20 is a region into which magnesium (an example of a group II element) has been implanted. The magnesium implanted region 20 is formed by implanting magnesium from the front surface 11 of the body 10 of the group III nitride semiconductor substrate 1 in a depth direction thereof (a C direction). The magnesium implanted region 20 is exposed at the front surface 11 of the body 10. The magnesium implanted region 20 exists in a range from the front surface 11 of the body 10 to a predetermined depth. A depth of the magnesium implanted region 20 can be adjusted by adjusting energy for the implantation of magnesium. Further, a concentration of magnesium in the magnesium implanted region 20 can be adjusted by adjusting a dose amount of magnesium. A peak concentration of magnesium in the magnesium implanted region 20 is, for example, 1E19 $cm^3$. The concentration of magnesium in the magnesium implanted region 20 is higher than a concentration of magnesium in a region adjacent to the magnesium implanted region 20. The concentration of magnesium in the region adjacent to the magnesium implanted region 20 is low enough to be ignored with respect to the concentration of magnesium in the magnesium implanted region 20. A region adjacent to the magnesium implanted region 20 in the depth direction of the group III nitride semiconductor substrate 1 is a region denoted with a sign 50. A region adjacent to the magnesium implanted region 20 in a direction along the front surface 11 of the group III nitride semiconductor substrate 1 is a region denoted with a sign 60.

The group III nitride semiconductor substrate 1 comprises a p-type conduction region 51 and an n-type conduction region 52. The p-type conduction region 51 is formed by implanting magnesium from the front surface 11 of the group nitride semiconductor substrate 1 in the depth direction thereof (the C direction). The n-type conduction region 52 is outside the p-type conduction region 51. The n-type conduction region 52 is adjacent to the p-type conduction region 51. The p-type conduction region 51 has p-type conductivity, and the n-type conduction region 52 has n-type conductivity. A concentration of magnesium in the p-type conduction region 51 is higher than a concentration of magnesium in the n-type conduction region 52. A range where the p-type conduction region 5 exists and a range where the n-type conduction region 52 exists are determined depending on a balance between a concentration of p-type dopant and a concentration of n-type dopant after magnesium has been implanted into the body 10 of the group III nitride semiconductor substrate 1. Specifically, a position at which the p-type dopant equals to the n-type dopant becomes an interface between the p-type conduction region 51 and the n-type conduction region 52. Due to this, the magnesium implanted region 20 does not necessarily coincide with the p-type conduction region 51.

The group III nitride semiconductor substrate 1 further comprises a hydrogen implanted region 30. The hydrogen implanted region 30 is a region into which hydrogen has been implanted. The hydrogen implanted region 30 is formed by implanting hydrogen from the front surface 11 of the body 10 of the group III nitride semiconductor substrate 1 in the depth direction thereof (the C direction). In the depth direction of the group III nitride semiconductor substrate 1 (the C direction), the hydrogen implanted region 30 exists in a range from the magnesium implanted region 20 across the region adjacent to the magnesium implanted region 20. The hydrogen implanted region 30 exists up to a deeper position than the magnesium implanted region 20. The hydrogen implanted region 30 exists so as to overlap a boundary portion 70 between the magnesium implanted region 20 and the region adjacent thereto in the depth direction of the group III nitride semiconductor substrate 1. The hydrogen implanted region 30 extends from a certain position in the magnesium implanted region 20 into the region 50 adjacent to the magnesium implanted region 20 by crossing a lower end 21 of the magnesium implanted region 20. In a cross-sectional view along A-A in FIG. 1, an upper end 31 of the hydrogen implanted region 30 is located in the magnesium implanted region 20, and a lower end 31 of the hydrogen implanted region 30 is located in the region adjacent to the magnesium implanted region 20. A position of the hydrogen implanted region 30 in the depth direction (the C direction) can be adjusted by adjusting energy for the implantation of hydrogen from the front surface 11 of the group III nitride semiconductor substrate 1. Further, a concentration of hydrogen in the hydrogen implanted region 30 can be adjusted by adjusting a dose amount of hydrogen. A peak concentration of hydrogen in the hydrogen implanted region 30 is, for example, $2E20$ $cm^{-3}$. The concentration of hydrogen in the hydrogen implanted region 30 is higher than a concentration of hydrogen in a region adjacent to the hydrogen implanted region 30. The concentration of hydrogen in the region adjacent to the hydrogen implanted region 30 is low enough to be ignored with respect to the concentration of hydrogen in the hydrogen implanted region 30. A region adjacent to the hydrogen implanted region 30 in the depth direction of the group III nitride semiconductor substrate 1 is a region denoted with a sign 80. A region adjacent to the hydrogen implanted region 30 in the direction along the front surface 11 of the group III nitride semiconductor substrate 1 is a region denoted with a sign 90. The hydrogen implanted region 30 is formed in the n-type conduction region 52. Therefore, the region denoted with the sign 50 may include a small amount of group II element (magnesium) whose concentration is lower than the concentration of n-type dopant.

Further, by implanting hydrogen from the front surface 11 of the body 10 of the group III nitride semiconductor substrate 1 in the depth direction thereof (the C direction), hydrogen is implanted into the n-type conduction region 52. In course of the implantation of hydrogen, a small amount of hydrogen may be implanted into the p-type conduction region 51, in some cases. A concentration of hydrogen in the n-type conduction region 52 is higher than a concentration of hydrogen in the p-type conduction region 51.

Figure 2:
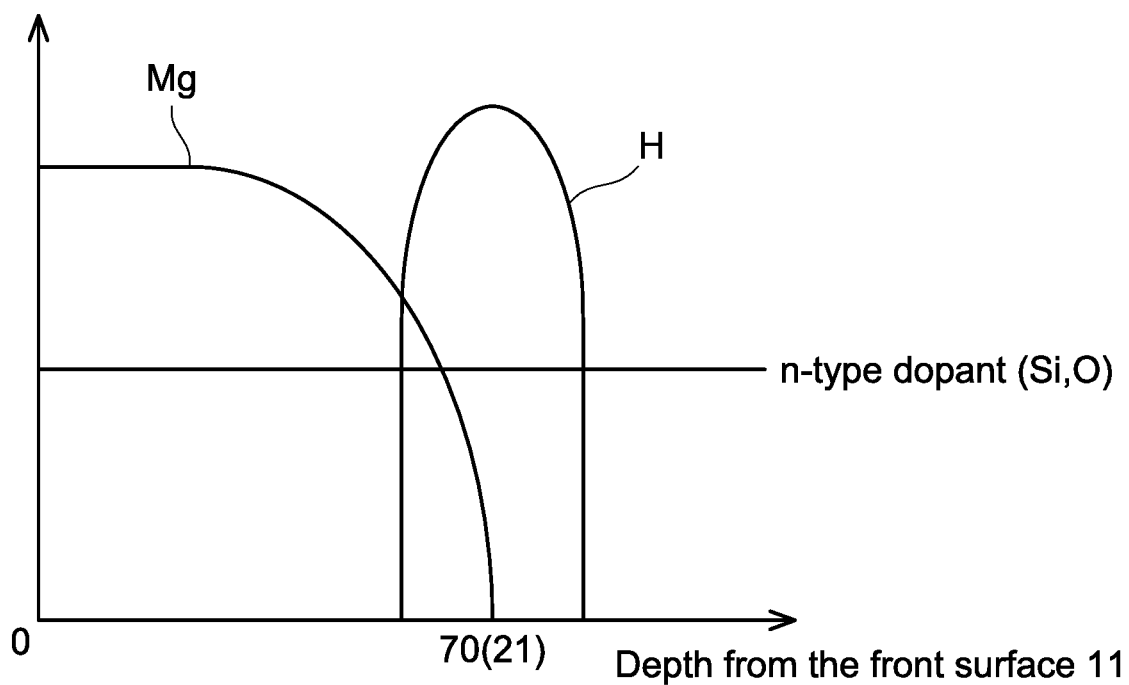
FIG. 2 is a profile of a concentration of magnesium and a concentration of hydrogen that have been implanted into the group III nitride semiconductor substrate of the first embodiment.

As shown in FIG. 2, a depth having the peak concentration of hydrogen in the hydrogen implanted region 30 is located deeper than a depth having the peak concentration of magnesium in the magnesium implanted region 20. Due to this, the peak concentration of hydrogen can be formed in the n-type conduction region 52.

The group III nitride semiconductor substrate 1 of the first embodiment has been described as above. As is apparent from what is described above, the group III nitride semiconductor substrate 1 includes the p-type conduction region 51 into which magnesium has been implanted from the front surface 11 in the depth direction (the C direction) and having p-type conductivity. Further, hydrogen has been implanted from the p-type conduction region 51 across the n-type conduction region 52 adjacent to the p-type conduction region 51 in the depth direction of the group III nitride semiconductor substrate 1.

Point defects formed by the implantation of magnesium into the group III nitride semiconductor substrate 1 include gallium (Ga) vacancies and nitrogen (N) vacancies. The nitrogen vacancies are likely to be formed in the p-type conduction region 51 and compensate acceptors. In the group nitride semiconductor substrate 1, hole mobility is lower than electron mobility by approximately double digits, and an acceptor active rate is also low. Due to this, in the p-type conduction region 51, carrier conduction (hole conduction) is greatly affected by compensation effect. Further, complex defects of the gallium vacancy, the nitrogen vacancy and hydrogen have lower formation energy than complex defects of the gallium vacancy and the nitrogen vacancy. Due to this, by implanting hydrogen into the n-type conduction region 52 and performing active annealing, the complex defects of the gallium vacancy, the nitrogen vacancy and hydrogen can be aggregated in the n-type conduction region 52. By providing the peak concentration of hydrogen in a portion of the n-type conduction region 52 that is apart from the interface, at which electric field concentrates, between the p-type conduction region 51 and the n-type conduction region 52, a leakage current when a reverse voltage is applied can be further reduced.

Further, the group III nitride semiconductor substrate 1 includes the magnesium implanted region 20 into which magnesium has been implanted from the front surface 11 in the depth direction (the C direction). The concentration of magnesium in the magnesium implanted region 20 is higher than the concentration of magnesium in the region adjacent to the magnesium implanted region 20. Further, the group III nitride semiconductor substrate 1 includes the hydrogen implanted region 30 into which hydrogen has been implanted from the magnesium implanted region 20 across the region adjacent to the magnesium implanted region 20 in the depth direction. The concentration of hydrogen in the hydrogen implanted region 30 is higher than the concentration of hydrogen in the region adjacent to the hydrogen implanted region 30.

Figure 3:
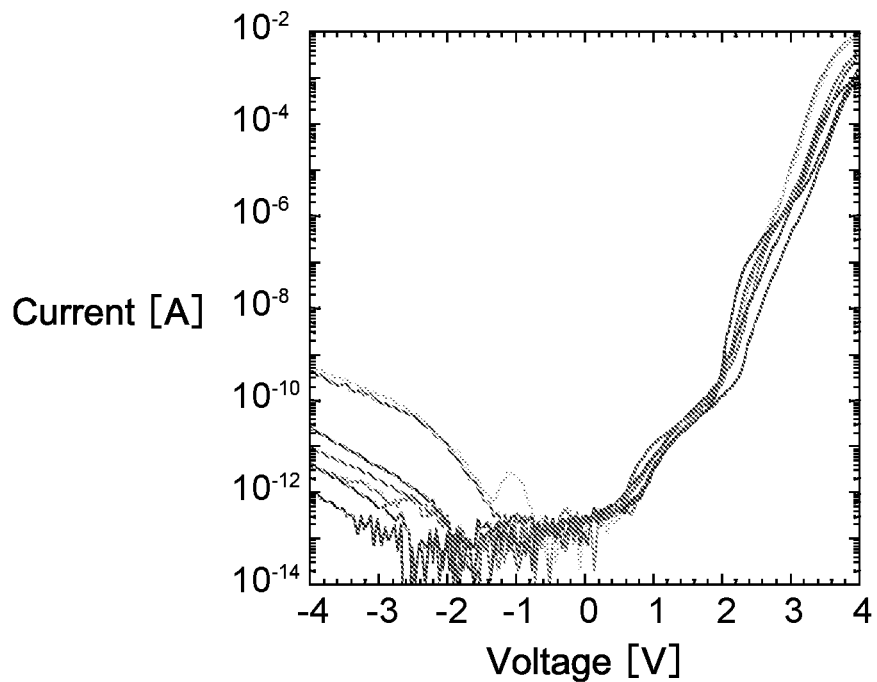
FIG. 3 is a graph (1) showing a relationship between voltage and current in a diode using the group III nitride semiconductor substrate.
Figure 4:
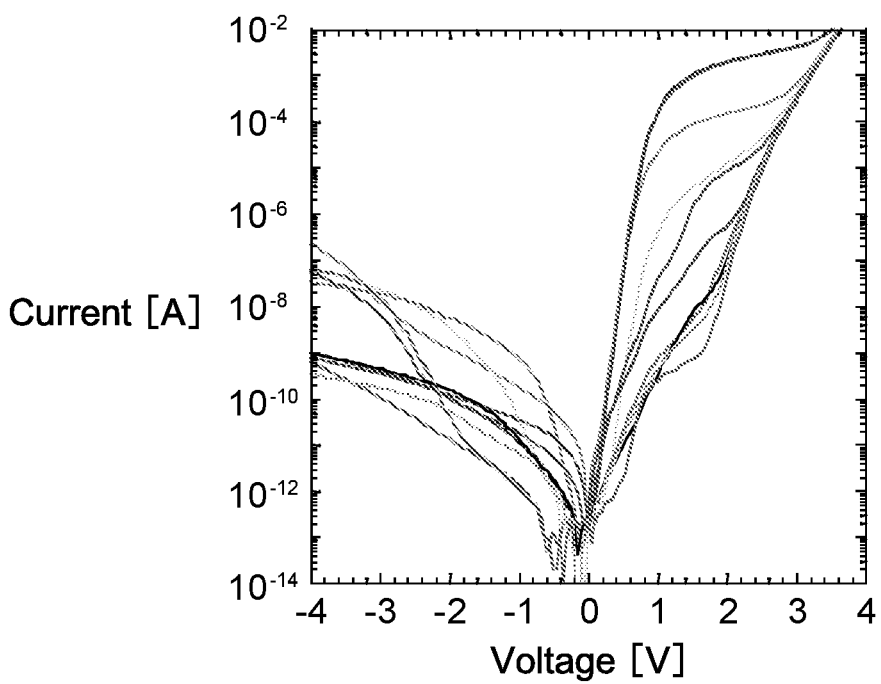
FIG. 4 is a graph (2) showing a relationship between voltage and current in a diode using a group III nitride semiconductor substrate.

FIG. 3 is a graph showing a relationship between voltage and current in a diode using the aforementioned group III nitride semiconductor substrate 1 into which magnesium and hydrogen have been implanted. Further, FIG. 4 is a graph showing a relationship between voltage and current in a diode using a group III nitride semiconductor substrate into which hydrogen has not been implanted and magnesium has been implanted. As a result of study related to group III nitride semiconductor substrates, as shown in FIG. 3 and FIG. 4, it has been revealed that a leakage current in case of FIG. 3 is smaller than a leakage current in case of FIG. 4 when a reverse voltage is applied. In the case of FIG. 3, the leakage current is approximately $10^{-12}$ to $10^{-10}$ when the reverse voltage is $-4V$. Meanwhile, in the case of FIG. 4, the leakage current is approximately $10^{-9}$ to $10^{-7}$ when the reverse voltage is $-4V$. According to the configuration of the aforementioned group III nitride semiconductor substrate 1, the hydrogen implanted region 30 into which hydrogen has been implanted exists from the p-type conduction region 51 across the n-type conduction region 52, and the peak concentration is in the n-type conduction region 52, and thus a leakage current in the boundary portion, at which electric field concentrates, between the p-type conduction region 51 and the n-type conduction region 52 can be reduced when a reverse voltage is applied. Therefore, a leakage current when a reverse voltage is applied can be further reduced as compared to conventional techniques in which the hydrogen implanted region exists in the only magnesium implanted region. In the group III nitride semiconductor substrate 1, a front surface 11 side is an anode side, and a rear surface 12 side is a cathode side.

Further, by providing the position having the peak concentration of hydrogen on an n-type conduction region 52 side relative to the boundary portion between the p-type conduction region 51 and the n-type conduction region 52, a peak position of the complex defects of the group iii element vacancy (the gallium vacancy), the nitrogen vacancy and hydrogen can be located apart from the boundary portion at which the electric field concentrates. That is, the leakage current can be further reduced.

Further, in the aforementioned group III nitride semiconductor substrate 1, the front surface 11 is a nitrogen polar face. Since the nitrogen polar face exhibits high thermal stability, nitrogen located at an uppermost surface of the nitrogen polar face does not escape (the crystal is not thermally decomposed) even when the group III nitride semiconductor substrate 1 is heated to 1000 degrees Celsius. Due to this, there is no need to cover the front surface 11 of the group III nitride semiconductor substrate 1 by a protection film when a heating treatment is performed thereon. If the front surface 11 is covered by a protection film when a heating treatment is performed, an element constituting the protection film may enter inside of the group nitride semiconductor substrate 1.

While one embodiment has been described above, specific aspects are not limited to the embodiment. Hereinbelow, configurations that are same as the configurations described above are given the same signs and descriptions thereof will be omitted.

Figure 5:
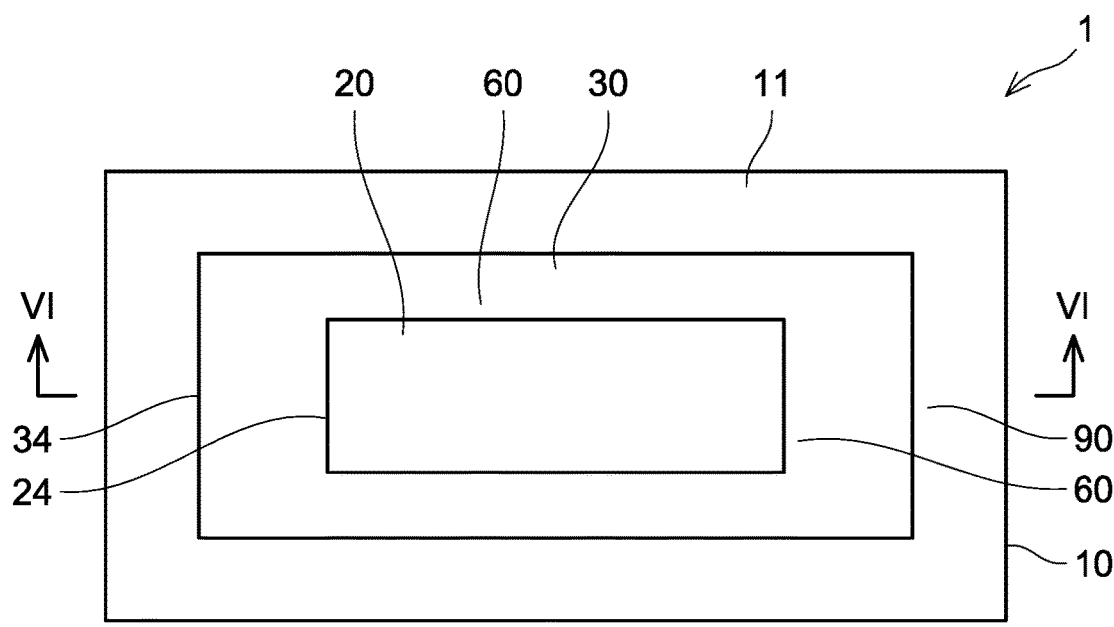
FIG. 5 is a planer view of a group III nitride semiconductor substrate of a second embodiment.

FIG. 5 is a view of the front surface 11 in a direction orthogonal to the front surface of the group III nitride semiconductor substrate 1 (a view of the front surface 11 in the C direction) of a second embodiment. As shown in FIG. 5, the hydrogen implanted region 30 is exposed at the front surface 11 in the group III nitride semiconductor substrate 1 of the second embodiment. In the direction along the front surface 11 of the group III nitride semiconductor substrate 1, the hydrogen implanted region 30 exists from the magnesium implanted region 20 across the region adjacent to the magnesium implanted region 20. The magnesium implanted region 20 exists in a part (a center part) of the front surface 11 of the group III nitride semiconductor substrate 1. The hydrogen implanted region 30 exists within and outside the magnesium implanted region 20. The hydrogen implanted region 30 exists in a range from the magnesium implanted region 20 to a surround of the magnesium implanted region 20. The hydrogen implanted region 30 surrounds the magnesium implanted region 20.

Figure 6:
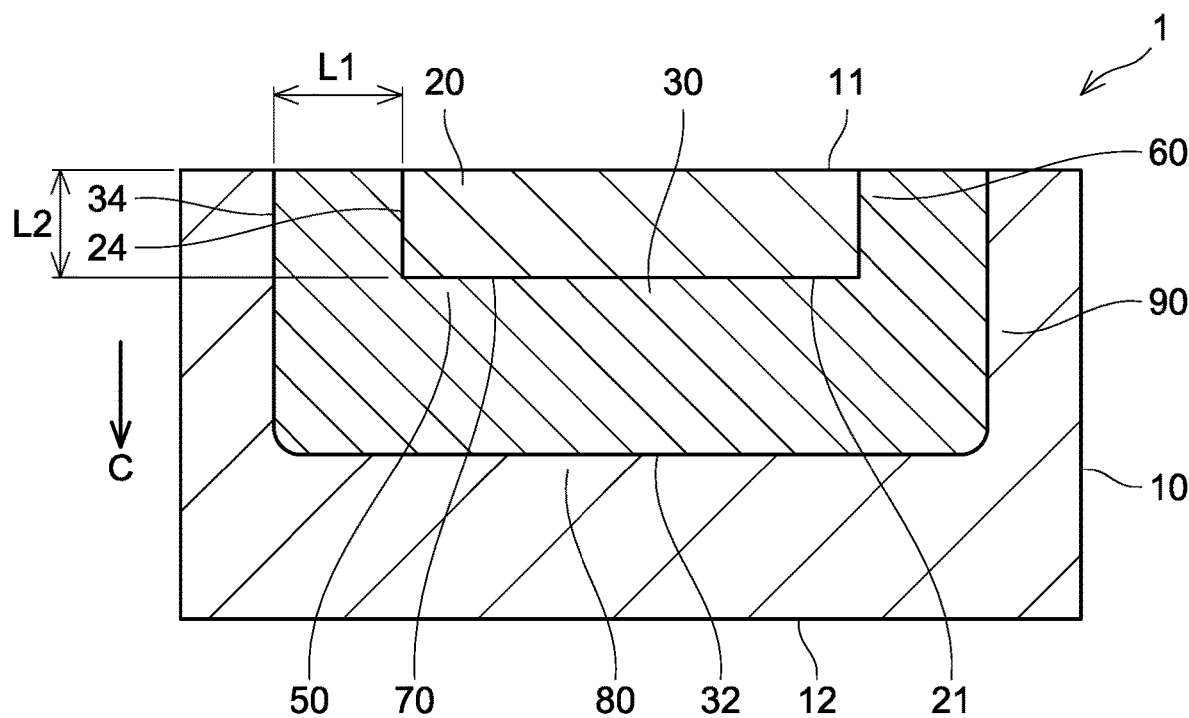
FIG. 6 is a cross-sectional view of the group III nitride semiconductor substrate of the second embodiment (a cross-sectional view along VI-VI in FIG. 5)

FIG. 6 is a cross-sectional view along VI-VI in FIG. 5. As shown in FIG. 6, a periphery 34 of the hydrogen implanted region 30 is located on an outer side than a periphery 24 of the magnesium implanted region 20. A distance L1 from the periphery 24 of the magnesium implanted region 20 to the periphery 34 of the hydrogen implanted region 30 is longer than a distance L2 from the front surface 11 of the group III nitride semiconductor substrate 1 to the lower end 21 of the magnesium implanted region 20. L1>L2 is satisfied. The distance L1 is a distance in the direction along the front surface 11. The distance L2 is a distance in the depth direction of the group III nitride semiconductor substrate 1 (the C direction). The hydrogen implanted region 30 exists in a region from the front surface 11 of the group III nitride semiconductor substrate 1 to a deeper position than the lower end 21 of the magnesium implanted region 20.

Figure 7:
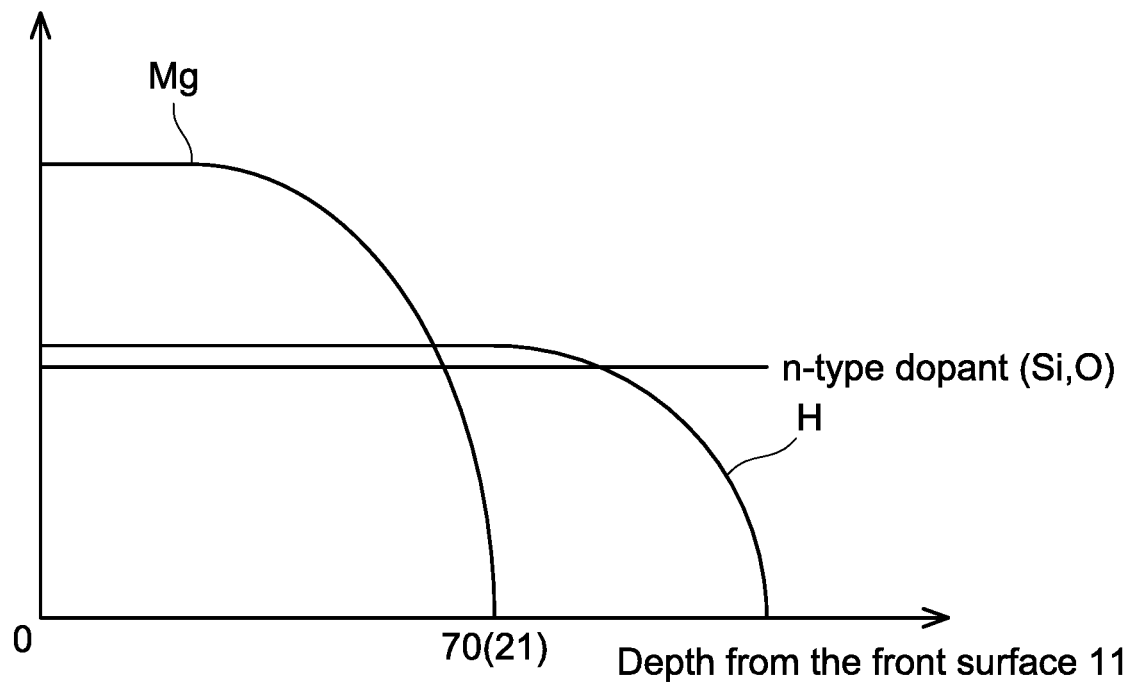
FIG. 7 is a profile of a concentration of magnesium and a concentration of hydrogen that have been implanted into the group III nitride semiconductor substrate of the second embodiment.

As shown in FIG. 7, the concentration of hydrogen in the hydrogen implanted region 30 is lower than the concentration of magnesium in the magnesium implanted region 20. When the concentrations are compared to each other, they can be compared in terms of their peak concentrations.

The group III nitride semiconductor substrate 1 of the second embodiment has been described above. In this group III nitride semiconductor substrate 1, as shown in FIG. 5, the magnesium implanted region 20 exists in a part of the front surface 11. Further, in the direction along the front surface 11, the hydrogen implanted region 30 exists from the magnesium implanted region 20 across the region adjacent to the magnesium implanted region 20. According to this configuration, the hydrogen implanted region 30 expands not only in the depth direction of the group ill nitride semiconductor substrate 1 (the C direction) but also around the magnesium implanted region 20 in the direction along the front surface 11, by which the leakage current can be further reduced. Further, as shown in FIG. 6, the distance L1 is longer than the distance L2. Due to this, leakage current reduction effect can be enhanced.

Other Embodiments

While magnesium (Mg) is used as an example of group II element in the embodiments above, no limitation is placed thereto and the group II element may be, for example, beryllium (Be), calcium (Ca), or the like.

Further, while the front surface 11, which is the nitrogen polar face of the group nitride semiconductor substrate 1, is the −C plane. ([000-1] plane) in the embodiments above, no limitation is placed thereto and the nitrogen polar face used as the front surface 11 may be, for example, a [1-101] plane. Further, the front surface 11 of the group III nitride semiconductor substrate 1 may be a plane that is slightly tilted with respect to the −C plane.

Further, while the concentrations of the respective elements are compared to each other in terms of their peak concentrations in the embodiments above, no limitation is placed thereto and the concentrations may be compared to each other in terms of their average concentrations. Further, while only one magnesium implanted region 20 and only one hydrogen implanted region 30 are provided in the embodiments above, a plurality of the magnesium implanted regions 20 and a plurality of the hydrogen implanted regions 30 may be provided.

Figure 8:
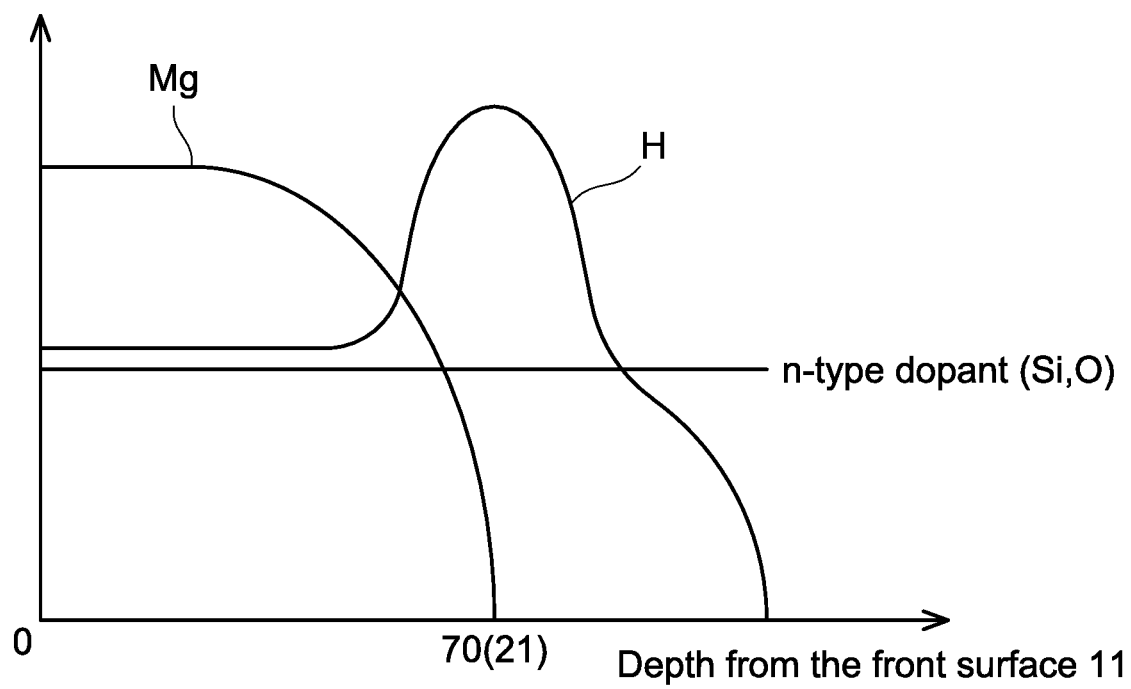
FIG. 8 is a profile of a concentration of magnesium and a concentration of hydrogen that have been implanted into a group III nitride semiconductor substrate of another embodiment.

Further, as shown in FIG. 8, the position having the peak concentration of hydrogen in the hydrogen implanted region 30 in the depth direction of the group III nitride semiconductor substrate 1 may overlap the boundary portion 70 between the magnesium implanted region 20 and the region adjacent thereto. Due to this, the peak concentration of hydrogen can be provided in the n-type conduction region 52 where the concentration of n-type dopant is higher than the concentration of p-type dopant. The position having the peak concentration of hydrogen overlaps the lower end 21 of the magnesium implanted region 20. The peak concentration of hydrogen in the hydrogen implanted region 30 is higher than the peak concentration of magnesium in the magnesium implanted region 20. At other positions, the concentration of hydrogen in the hydrogen implanted region 30 is lower than the concentration of magnesium in the magnesium implanted region 20.

Figure 9:
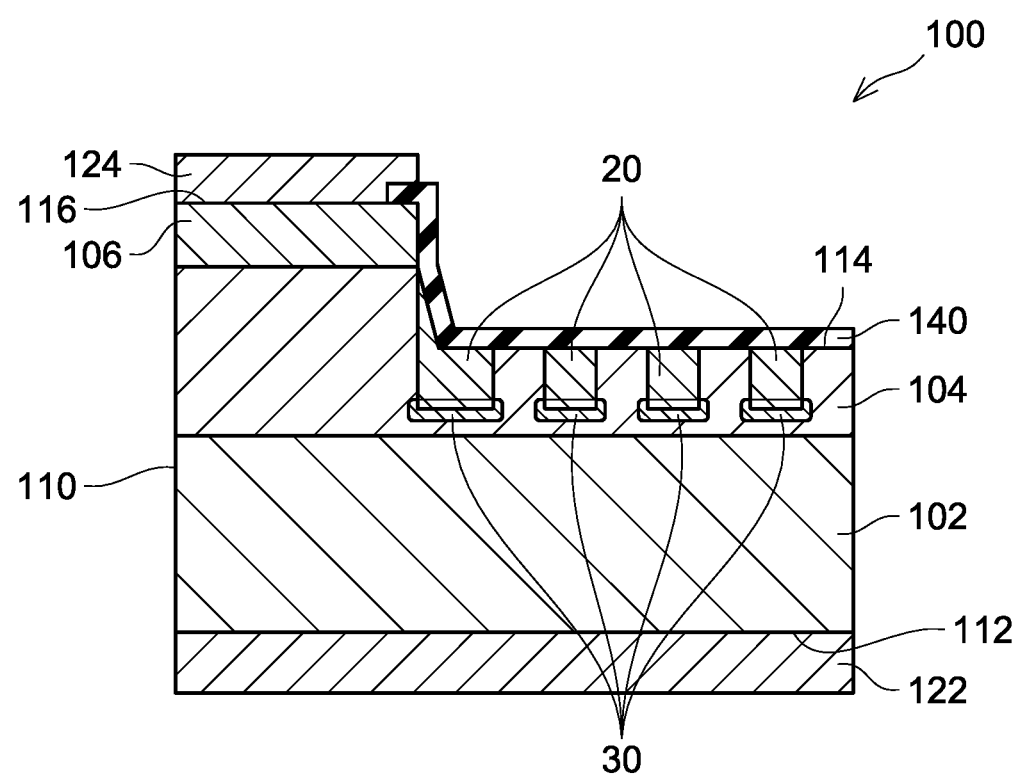
FIG. 9 is a cross-sectional view of a semiconductor device using the group III nitride semiconductor substrate of the embodiment.

Next, an example of a semiconductor device using the technique of the above group III nitride semiconductor substrate 1 will be described. As shown in FIG. 9, a semiconductor device 100 of an embodiment includes a semiconductor substrate 110. The semiconductor substrate 110 includes a first layer 102, a second layer 104 stacked on the first layer 102, and a third layer 106 stacked on the second layer 104. Each of the first layer 102 and the second layer 104 is a GaN layer of n-type. The third layer 106 is a GaN layer of p-type. The second layer 104 in this semiconductor device 100 corresponds to the group III nitride semiconductor substrate 1 described above. The second layer 104 includes a plurality of the magnesium implanted regions 20 and a plurality of the hydrogen implanted regions 30. The plurality of the magnesium implanted regions 20 and the plurality of the hydrogen implanted regions 30 are provided in a peripheral region of the semiconductor substrate 110. The plurality of the magnesium implanted regions 20 and the plurality of the hydrogen implanted regions 30 function as guard rings in the semiconductor device 100.

A rear electrode 122 is disposed on a rear surface 112 of the first layer 102. A rear surface 112 side of the first layer 102 is a cathode side. Further, a front electrode 124 is disposed on a front surface 116 of the third layer 106. A front surface 116 side of the third layer 106 is an anode side. A voltage is applied between the rear electrode 122 and the front electrode 124. Further, an insulator film 140 is disposed on a part of a front surface 114 of the second layer 104. The insulator film 140 covers the plurality of the magnesium implanted regions 20.

According to the semiconductor device 100 above, when a reverse voltage is applied between the rear electrode 122 and the front electrode 124, a leakage current in the peripheral region of the semiconductor substrate 110 can be reduced. The leakage current can be reduced by the presence of the magnesium implanted regions 20 and the hydrogen implanted regions 30.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A group III nitride semiconductor substrate comprising:
   a p-type conduction region into which a group II element has been implanted in a depth direction of the group III nitride semiconductor substrate from a surface of the group III nitride semiconductor substrate, the p-type conduction region having p-type conductivity,
   wherein
   hydrogen has been implanted from the p-type conduction region across an n-type conduction region adjacent to the p-type conduction region in the depth direction of the group III nitride semiconductor substrate.

2. The group III nitride semiconductor substrate according to claim 1, further comprising:
   a group II element implanted region into which a group II element has been implanted in the depth direction of the group III nitride semiconductor substrate from the surface of the group III nitride semiconductor substrate; and
   a hydrogen implanted region into which hydrogen has been implanted from the group II element implanted region across a region adjacent to the group II element implanted region in the depth direction of the group III nitride semiconductor substrate,
   wherein a concentration of the group II element in the group II element implanted region is higher than a concentration of the group II element in the region adjacent to the group II element implanted region, and
   a concentration of hydrogen in the hydrogen implanted region is higher than a concentration of hydrogen in a region adjacent to the hydrogen implanted region.

3. The group III nitride semiconductor substrate according to claim 1, wherein the surface of the group III nitride semiconductor substrate is a nitrogen polar face.

4. The group III nitride semiconductor substrate according to claim 1, wherein in a view of the surface of the group III nitride semiconductor substrate in a direction orthogonal to the surface, the group II element implanted region exists in a part of the surface, and
   in a direction along the surface, the hydrogen implanted region exists from the group II element implanted region across a region adjacent to the group II element implanted region.

5. The group III nitride semiconductor substrate according to claim 4, wherein a distance from a periphery of the group II element implanted region to a periphery of the hydrogen implanted region in the view of the surface of the group III nitride semiconductor substrate in the direction orthogonal to the surface is longer than a distance from the surface of the group III nitride semiconductor substrate to a lower end of the group II element implanted region in the depth direction of the group III nitride semiconductor substrate.

6. The group III nitride semiconductor substrate according to claim 1, wherein the group II element implanted into the group II element implanted region is magnesium.

* * * * *